United States Patent
Bacchus et al.

(10) Patent No.: US 7,219,322 B2
(45) Date of Patent: May 15, 2007

(54) MULTIPLE PROPAGATION SPEEDS OF SIGNALS IN LAYERED CIRCUIT APPARATUS

(75) Inventors: Reza M. Bacchus, Spring, TX (US); Stephen F. Contreras, Spring, TX (US); Mitchel E. Wright, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 340 days.

(21) Appl. No.: 10/832,633

(22) Filed: Apr. 27, 2004

(65) Prior Publication Data

US 2005/0240888 A1  Oct. 27, 2005

(51) Int. Cl.
*H04L 7/00* (2006.01)
*G05B 13/14* (2006.01)
*G06F 9/02* (2006.01)
*G06F 3/00* (2006.01)
*G06F 17/50* (2006.01)

(52) U.S. Cl. .................. 716/10; 716/13; 716/14; 716/4; 712/225; 710/38; 710/305; 340/825.2; 340/3.2

(58) Field of Classification Search .................. 716/10, 716/13, 14, 4; 712/225; 710/38, 305; 340/825.2, 340/3.2
See application file for complete search history.

(56) References Cited

U.S. PATENT DOCUMENTS

| 4,564,943 | A | * | 1/1986 | Collins et al. ............... 714/745 |
| 5,610,833 | A | * | 3/1997 | Chang et al. ................. 716/11 |
| 5,787,260 | A | * | 7/1998 | Misaka ....................... 710/100 |
| 6,484,299 | B1 | * | 11/2002 | Larsen ........................... 716/6 |
| 6,505,332 | B1 | * | 1/2003 | Oda ............................. 716/12 |
| 6,629,302 | B2 | * | 9/2003 | Miura et al. ................... 716/8 |
| 6,698,000 | B2 | * | 2/2004 | Tanaka ........................... 716/2 |
| 6,711,730 | B2 | * | 3/2004 | Frank et al. .................. 716/18 |
| 6,721,930 | B2 | * | 4/2004 | Sasaki et al. ................... 716/6 |
| 6,794,674 | B2 | * | 9/2004 | Kusumoto .................... 327/524 |
| 6,978,434 | B1 | * | 12/2005 | Shigyo et al. ................. 716/13 |
| 2002/0104064 | A1 | * | 8/2002 | Sasaki et al. ................... 716/6 |
| 2003/0005397 | A1 | * | 1/2003 | Larsen ........................... 716/6 |
| 2006/0059445 | A1 | * | 3/2006 | Shigyo et al. ................... 716/5 |

FOREIGN PATENT DOCUMENTS

JP 02239653 A * 9/1990
JP 2001217509 A * 8/2001

OTHER PUBLICATIONS

NN67041635, "Delay Line for Use with Integrated Circuits", IBM Technical Disclosure Bulletin, vol. 9, No. 11, Apr. 1967, pp. 1635-1636 (3 pages).*
Microlam 410 Dielectric, Data Sheet, W. L. Gore and Associates, Inc. Electronic Products Division, Feb. 2002, 2 pages.
Microlam 630 Dielectric, Data Sheet, W. L. Gore and Associates, Inc. Electronic Products Division, Feb. 2002, 2 pages.
SPEEDBOARD C Design Benefits, W. L. Gore & Associates, Inc., Electronic Material Products, Mar. 22, 2001, 2 pages.

* cited by examiner

*Primary Examiner*—Phallaka Kik

(57) ABSTRACT

A first signal passes through a first layer of a circuit apparatus at a first propagation speed, and a second signal passes through a second layer of the circuit apparatus at a second propagation speed different from the first propagation speed.

22 Claims, 3 Drawing Sheets

ADJUSTED EXEMPLARY SIGNALS

MULTIPLE PROPAGATION SPEEDS OF SIGNALS IN LAYERED CIRCUIT APPARATUS

BACKGROUND

Some signals transferred within computer systems have very strict timing constraints. For example, specifications that define computer bus systems often require that the signals of the bus system arrive at each node of the bus system at the same time, or within an acceptable tolerance. The bus signals must be synchronized so they can be read at a receiving node at the same time. Otherwise, data transmitted over the bus system could be corrupted, and the computer would not work.

A physical signal-transmission portion of the bus system commonly includes signal lines formed in a printed circuit board (PCB). The bus signals travel, or propagate, through conductive traces disposed in various layers of the PCB between the nodes of the bus system. Each conductive trace forms a segment of one bus signal line.

In a common situation, the distance between one pair of nodes of the bus system is significantly different from the distance between another pair of nodes. If both conductive traces electrically connecting both pairs of nodes were routed through the PCB in the shortest manner possible, then the length of the conductive traces would potentially be significantly different. The difference in lengths of the conductive traces, if sufficiently large, would significantly impact the timing of the bus signals transmitted between each of the nodes. The specification for the bus system, however, requires that the timing of the bus signals be within an acceptable tolerance of each other.

To ensure that the signal timing requirements are met, the shorter conductive trace is artificially made longer to have a length about the same as the length of the longer conductive trace. To lengthen the shorter conductive trace, the conductive trace is routed in a serpentine manner for a portion of its length. The bus signals, thus, propagate through the different conductive traces in about the same amount of time.

The trace-lengthening technique for bus signal synchronization requires that there be sufficient space in the PCB for the added length of some of the conductive traces. However, as ICs become more complex, the number of nodes, and concurrently the number of conductive traces, increases. Additionally, as the PCBs are made smaller, the space available for the conductive traces decreases. The increasing number and density of the conductive traces is incompatible with the decreasing space in the PCBs and places severe constraints on the layout of the PCB.

One solution to this problem has been to increase the number of layers in the PCB in which the conductive traces can be formed. However, this solution increases the thickness of the PCBs and increases the time, complexity and cost of manufacturing the PCBs.

DETAILED DESCRIPTION

Figure 1:
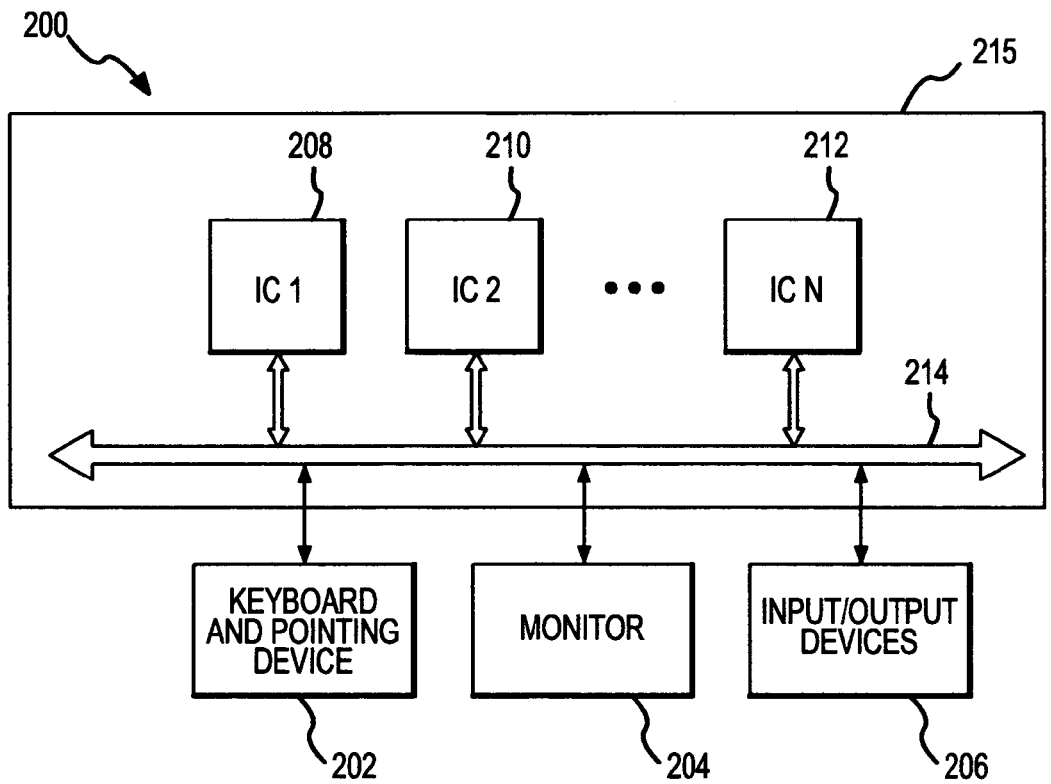
FIG. 1 is a simplified block diagram of a computer system according to an embodiment of the present invention.

A computer system 200 incorporating an embodiment of the present invention is shown in FIG. 1. The computer system 200 generally includes user interface devices, such as a keyboard and pointing device 202 and a monitor 204. The computer system 200 also generally includes various I/O devices 206 and various integrated circuits (ICs) 208, 210 and 212. The components 202–212 are generally connected by a variety of signals and bus systems 214. The ICs 208–212 are preferably any appropriate computer chips, such as processors and ASICs (application specific ICs), among others, mounted within a housing 215. The bus systems 214 may include serial (i.e. having one or few signals) and/or parallel (i.e. having several signals) bus systems.

Figure 2:
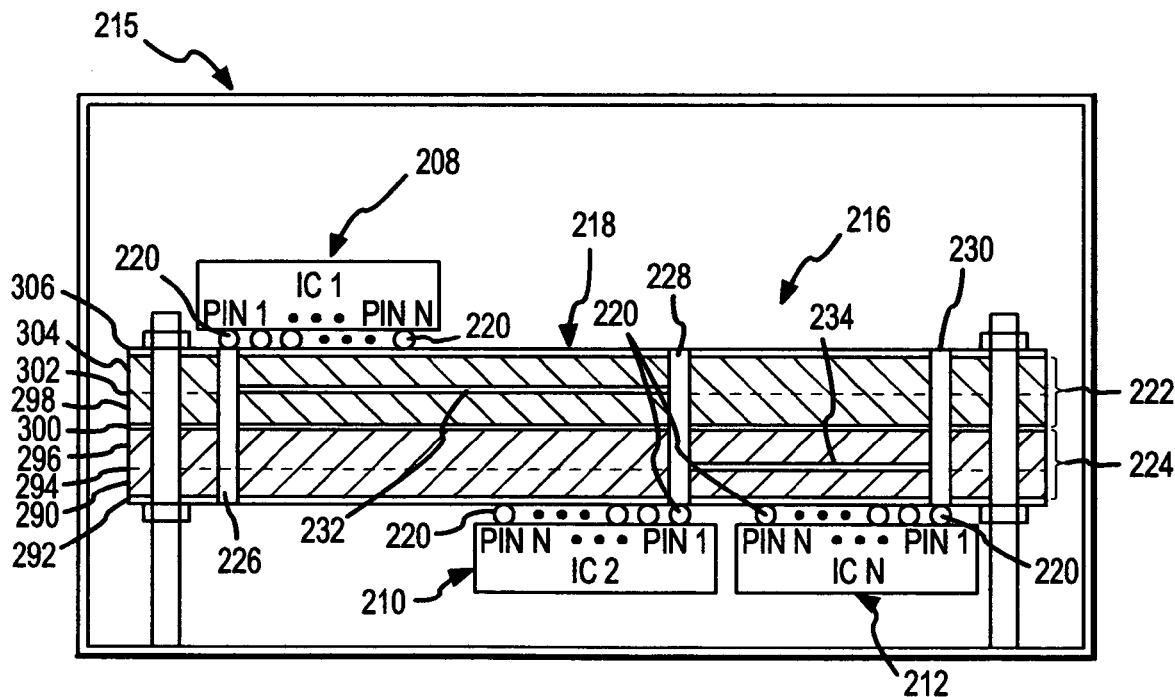
FIG. 2 is a simplified cross section of the computer system shown in FIG. 1 and of a PCB incorporated therein according to an embodiment of the present invention.

The ICs 208–212 and the bus system 214 connecting the ICs 208–212 are preferably incorporated in a populated printed circuit board 216 mounted within the housing 215, as shown in FIG. 2. In addition to the ICs 208–212, the populated printed circuit board 216 preferably includes a board 218 on which the ICs 208–212 and any other components are mounted, e.g. by soldering. The ICs 208–212 generally include several I/O points 220, e.g. pins, leads, solder balls, etc., connected to the board 218. The board 218 preferably includes several layers 222 and 224, several vias 226, 228 and 230 and several conductive traces 232 and 234. The vias 226, 228 and 230 and the conductive traces 232 and 234 generally form signal paths through which electronic signals (e.g. bus signals, clock signals, control signals, etc.) are transferred within the board 218 between the components mounted thereon.

To form the bus system 214, the ICs 208–212 are connected together at corresponding I/O points 220 by the vias 226–230 and the conductive traces 232 and 234. For example, corresponding I/O points (pin 1$s$) 220 of the ICs 208 and 210 are connected through the via 226, the conductive trace 232 and the via 228. Similarly, corresponding I/O points (pin 1$s$) 220 of the ICs 210 and 212 are connected through the via 228, the conductive trace 234 and the via 230. Each of the conductive traces 232 and 234, thus, forms a segment of one signal of the bus system 214. Additional conductive traces may form segments of any other signals between the components mounted on the board 218. Since each IC 208–212 is connected to more than one other IC 208–212 through each signal of the bus system 214, the bus system 214 is referred to as a "multi-drop bus." Additional vias and conductive traces within the board 218 may connect other I/O points on the ICs 208–212 and/or other components on the populated printed circuit board 216 whether connected by the bus system 214 or by any other signal lines.

Figure 3:
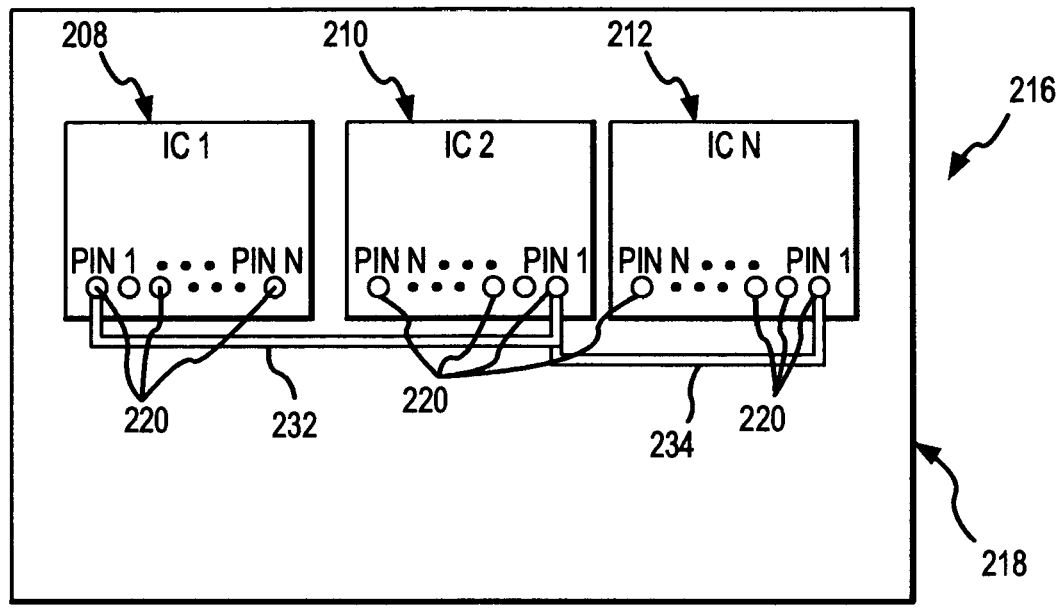
FIG. 3 is a simplified schematic view of the PCB shown in FIG. 2 according to an embodiment of the present invention.

As shown in FIG. 3, though not necessarily drawn to scale, each of the signal segments, or conductive traces 232 and 234, is of a different length, which is preferably minimized so as to take up as little space in the board 218 as possible. In particular, conductive trace 232 is longer than conductive trace 234. Bus specifications, however, typically require that the propagation time through each segment of the bus system 214 be about the same, within a tolerance (on the order of 10 s to 100 s of picoseconds) of each other or of a specified time period, or within a specified time range. To ensure that signals arrive at each I/O point 220 within a desired propagation time range, the material of each layer 222 and 224 (FIG. 2) surrounding the conductive traces 232 and 234 is selected for its effect on the propagation speed (measured in picoseconds per inch) of the signals transmitted through the conductive traces 232 and 234. Since electrical signals propagate faster through conductive traces surrounded by material having a lower dielectric constant, the material of the layer 222 surrounding the longer conductive trace 232 preferably has a lower dielectric constant than does the material of the layer 224 surrounding the shorter conductive trace 234. In this manner, the signals transferred through the longer conductive trace 232 propagate within about the same amount of time as the signals transferred through the shorter conductive trace 234. In other words, the "length ratio" of the longer conductive trace 232 to the shorter conductive trace 234 is preferably about the same as the "speed ratio" of the faster propagation speed to the slower propagation speed for the layers 222 and 224. Thus, the speed ratio for the layers 222 and 224 may be used to determine a range of allowable lengths for the conductive traces 232 and 234.

Although the description herein relates to the bus system 214, it is understood that the invention is not so limited, but may also apply to other situations having bus and/or non-bus signals that have preferred timing constraints and which may be selectively placed in the layers 222 and 224 in order to affect the timing of these signals as desired. For example, distributed clock signals can be synchronized in this manner across a printed circuit board, an integrated circuit or other appropriate type of circuit apparatus.

Figure 4:
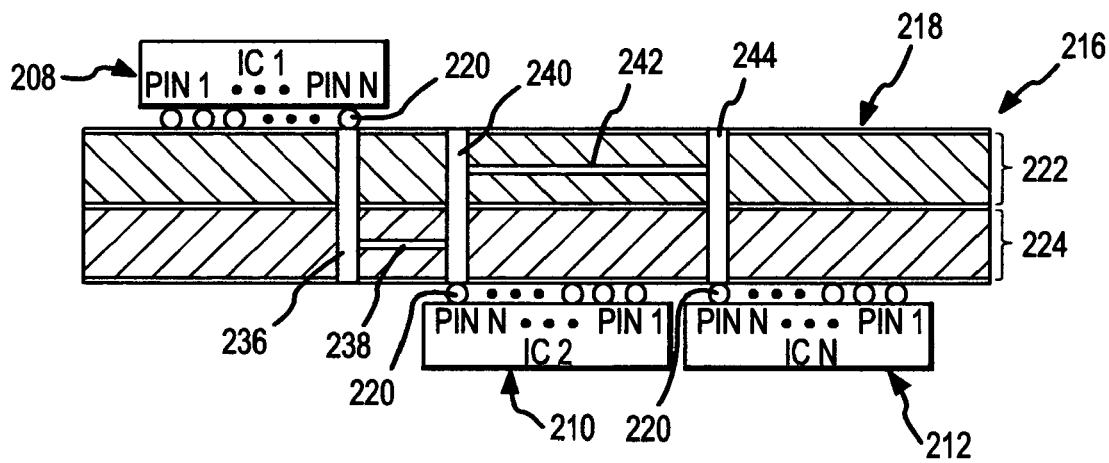
FIG. 4 is another simplified cross section of the PCB shown in FIG. 2 according to an embodiment of the present invention.

Similarly, as shown in FIG. 4, corresponding I/O points (pin Ns) 220 of the ICs 208 and 210 are connected through a via 236, a conductive trace 238 and a via 240. Additionally, corresponding I/O points (pin Ns) 220 of the ICs 210 and 212 are connected through the via 240, a conductive trace 242 and a via 244. Each of the conductive traces 238 and 242, thus, forms a bus segment of another signal of the bus system 214 (FIG. 1). The conductive trace 242 is longer than the conductive trace 238. Therefore, the longer conductive trace 242 is preferably placed in the layer 222 having the lower dielectric constant and, therefore, the faster propagation speed, and the shorter conductive trace 238 is preferably placed in the layer 224 having the higher dielectric constant and, therefore, the slower propagation speed. In this manner, the bus signals transferred through the longer conductive trace 242 propagate within about the same amount of time as the bus signals transferred through the shorter conductive trace 238.

Figure 5:
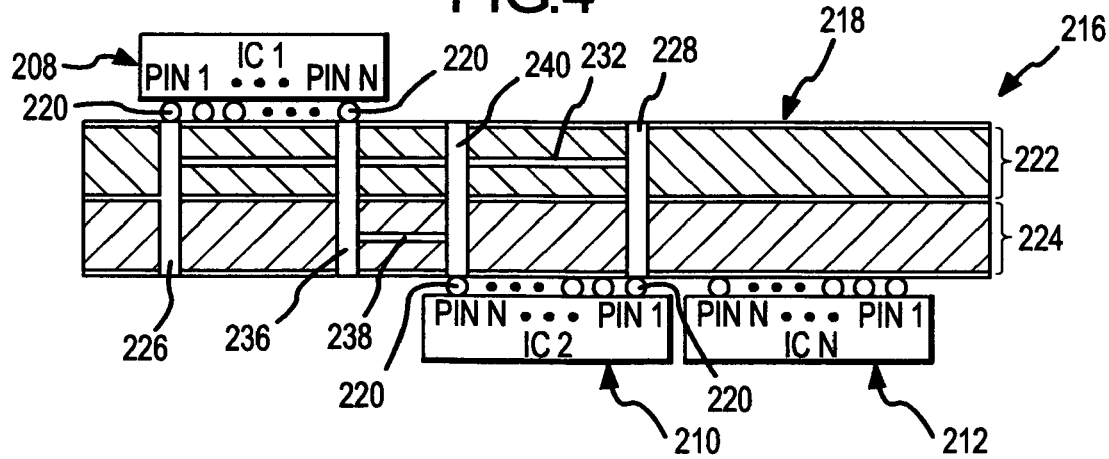
FIG. 5 is another simplified cross section of the PCB shown in FIG. 2 according to an embodiment of the present invention.

Additionally, according to an embodiment shown in FIG. 5, bus segments connecting different pairs of corresponding I/O points 220 are placed in the layers 222 and 224 depending on the lengths of the conductive traces 232 and 238. In this case, corresponding I/O points (pin 1s) 220 of the ICs 208 and 210 are connected through the via 226, the conductive trace 232 and the via 228, and corresponding I/O points (pin Ns) 220 of the ICs 208 and 210 are connected through the via 236, the conductive trace 238 and the via 240. In this manner, the bus signals transmitted through different bus segments between the same two ICs propagate within about the same amount of time.

Although not necessarily drawn to scale, the longer conductive trace 232 in FIGS. 2 and 5 is not necessarily the same length as the longer conductive trace 242 in FIG. 4, even though both conductive traces 232 and 242 are shown in the same layer 222. Similarly, although not necessarily drawn to scale, the shorter conductive trace 238 in FIGS. 4 and 5 is not necessarily the same length as the shorter conductive trace 234 in FIG. 2, even though both conductive traces 238 and 234 are shown in the same layer 224. Conductive traces of different lengths may be placed within the same layer 222 or 224, however, as long as the propagation times for each conductive trace is within the accepted propagation time range, or within an allowable tolerance of a specified time period.

Figure 6:
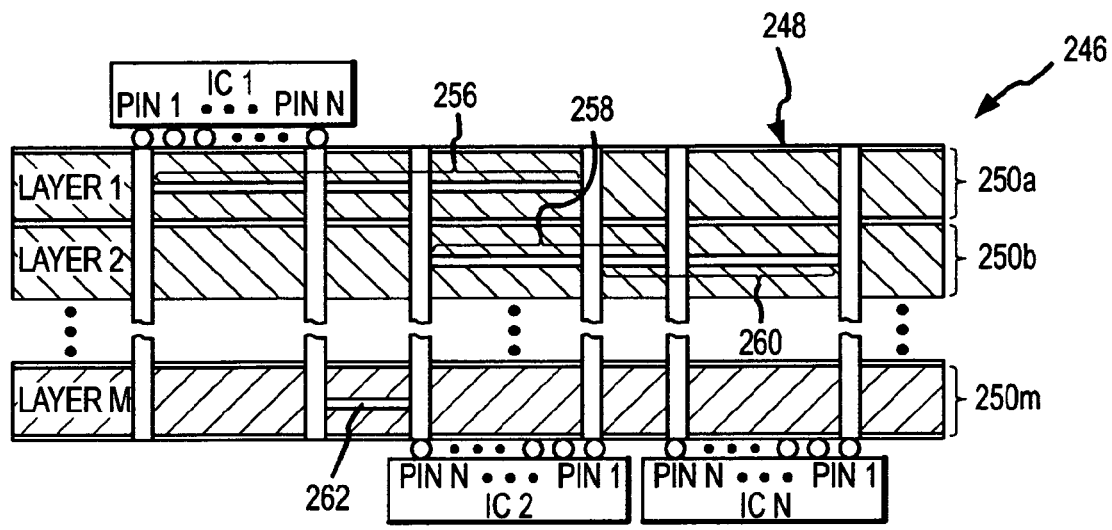
FIG. 6 is a simplified cross section of a PCB incorporated in the computer system shown in FIG. 1 according to an alternative embodiment of the present invention.

The embodiments shown in FIGS. 2, 4 and 5 have, for simplicity, shown only two layers 222 and 224 in the board 218. However, according to an embodiment of the present invention, as shown in FIG. 6, a populated printed circuit board 246 may include a board 248 having any appropriate number of layers 250*a*, 250*b* and 250*m* (layer 1, layer 2 . . . layer M). The actual number in a given situation may depend on the size of the bus, i.e. a bus with few signals could more easily get by with few layers, but a bus with many signals (e.g. hundreds of signals) may require several layers, each with a different dielectric material with a different propagation speed. In the example shown, thus, the materials for each layer 250*a*–250*m* are selected to give some of the layers 250*a*–250*m* different propagation speeds. Conductive traces (e.g. 256, 258, 260 and 262) are, therefore, preferably distributed among the layers 250*a*–250*m* according to the lengths of the conductive traces 256–262. For example, the longer conductive traces (e.g. 256) are preferably placed in the layer (e.g. 250*a*) having the fastest dielectric material, the shorter conductive traces (e.g. 262) are preferably placed in the layer (e.g. 250*m*) having the slowest dielectric material, and the intermediate-length conductive traces (e.g. 258 and 260) are preferably placed in the layer(s) (e.g. 250*b*) having intermediate-speed dielectric material(s).

Figure 7:
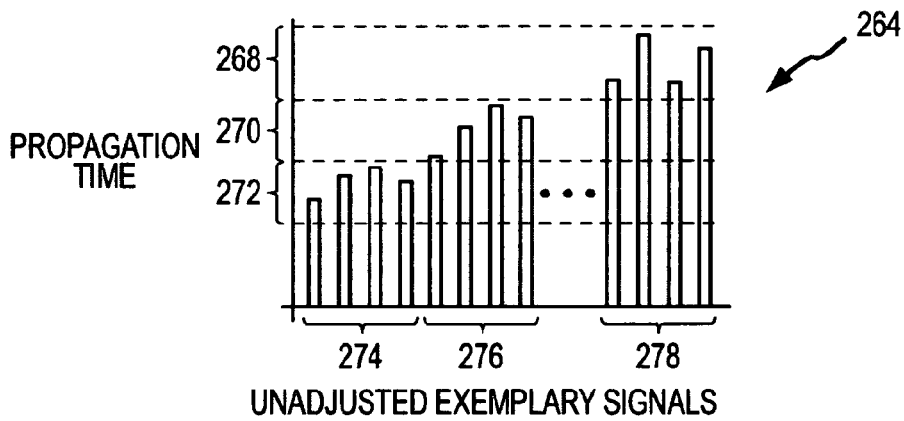
FIG. 7 is a simplified timing chart for propagation times of unadjusted exemplary signals propagating through a PCB.
Figure 8:
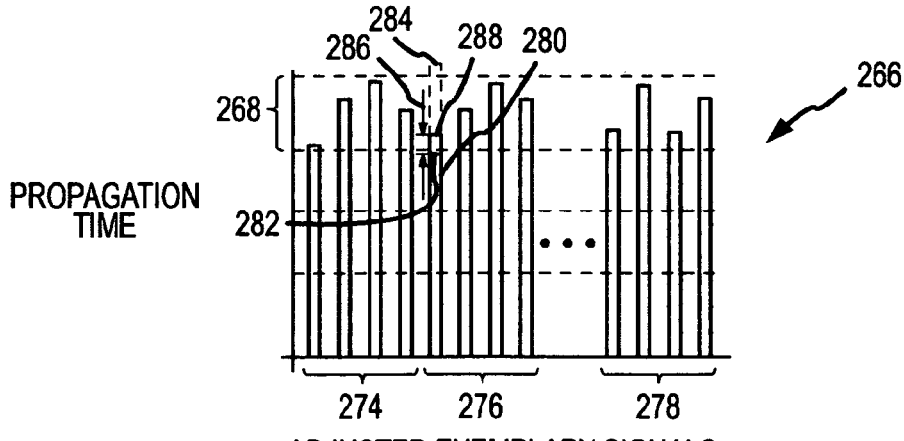
FIG. 8 is a simplified timing chart for propagation times of adjusted exemplary signals propagating through a PCB incorporated in the computer system shown in FIG. 1 according to an embodiment of the present invention.

The effect of the different dielectric materials on the bus signals in the layers 250*a*–250*m* is illustrated by time charts 264 and 266 shown in FIGS. 7 and 8, respectively, for "unadjusted exemplary signals" and "adjusted exemplary signals." The adjusted exemplary signals are preferably an exemplary set of bus signals propagating through the various layers 250*a*–250*m* of the board 248 (FIG. 6) at different propagation speeds. The unadjusted exemplary signals, on the other hand, represent the same bus signals under a hypothetical condition in which the propagation speeds are not adjusted by having materials with different dielectric constants for the layers 250*a*–250*m* of the board 248. In other words, the dielectric materials for the layers 250*a*–250*m* are the same for the unadjusted exemplary signals. Thus, the unadjusted exemplary signals have the same propagation speeds and, therefore, different propagation times.

In this example, as shown by FIG. 7, the propagation times fall into three ranges 268, 270 and 272, and the unadjusted exemplary signals fall into three corresponding groups of bus signals 274, 276 and 278. The bus signals 274 with the shortest propagation times propagate through the shortest conductive traces in the board 248, the bus signals 276 with the intermediate propagation times propagate through the intermediate-length conductive traces in the board 248, and the bus signals 278 with the longest propagation times propagate through the longest conductive traces in the board 248. The bus signals 274 and 276 that do not fall within the propagation time range 268 are to be adjusted according to an embodiment of the present invention, so the short and intermediate bus signals 274 and 276 will fall within the propagation time range 268.

The dielectric material for the layer (e.g. 250m, FIG. 6), which contains the shortest conductive traces (e.g. 262), is selected to have the slowest propagation speed. The dielectric material for the layer (e.g. 250a, FIG. 6), which contains the longest conductive traces (e.g. 256), is selected to have the fastest propagation speed. The dielectric material for the layer (e.g. 250b, FIG. 6), which contains the intermediate-length conductive traces (e.g. 258 and 260), is selected to have an intermediate propagation speed. In this manner, the propagation times for the bus signals 274 and 276 are effectively "stretched" to fall within the same propagation time range 268 as for the bus signals 278, as shown in FIG. 8. Thus, all of the bus signals 274, 276 and 278 propagate within the acceptable propagation time range 268.

One of the bus signals 280 is illustrated as an exception to the other bus signals in the groups of bus signals 274 and 276. If the bus signal 280 were placed in the board 248 in the minimum-length, most-economical signal path possible and adjusted only by placing the conductive trace for the bus signal 280 in the layer 250b with the intermediate-speed dielectric material, then the propagation time for the bus signal 280 would fall at point 282, outside of the acceptable propagation time range 268. On the other hand, if the bus signal 280 were adjusted by placing the conductive trace for the bus signal 280 in the layer 250m with the slowest dielectric material, then the propagation time for the bus signal 280 would fall at point 284, also outside of the acceptable propagation time range 268. Therefore, the bus signal 280 is preferably placed in the layer 250b with the intermediate-speed dielectric material, and the serpentine technique described in the background is preferably incorporated to "stretch," or lengthen, the bus signal 280 an additional amount of time 286. In this manner, the propagation time point 288 at which the bus signal 280 falls within the acceptable propagation time range 268. By thus combining the serpentine technique with an embodiment of the present invention, only a minimal amount of lengthening of the conductive trace for the bus signal 280 is required, so the additional space in the board 248 taken up by the serpentine portion of the conductive trace for the bus signal 280 is minimized.

The selection of the number of layers in the printed circuit board, the dielectric materials for each of the layers and the lengths and placements of each of the conductive traces for any given printed circuit board design may be determined by experiment or simulation. In this manner, timing problems and considerations may be identified for the design. The best placement of the conductive traces in the layers (to take into account such timing problems and considerations) may thus be determined by such methods. The most space-saving placement of the conductive traces typically minimizes the lengths of the conductive traces. Upon determining the minimum length for each conductive trace, the propagation time for a signal passing therethrough may be determined in order to identify timing problems between different signals, assuming initially that the layers are all made of the same dielectric material. If such timing problems exist, then different dielectric materials may be substituted in some or all of the layers, and the conductive traces placed in the appropriate layer. In this manner, the various characteristic propagation speeds of the available dielectric materials for the different layers may be taken into consideration in the design or simulation. A range of allowable lengths for the conductive traces may thus be determined from the ratio of the characteristic propagation speeds between any two layers in conjunction with the allowable propagation time constraints. Other parameters, such as the distance between a conductive trace and a ground plane as well as the thickness, width and resistance of the conductive traces, may also affect propagation speed and should be taken into consideration in designs and simulations. Additionally, when the propagation speeds of selected dielectric materials for different layers are insufficient to compensate for the differences in lengths of conductive traces within the layers, the shorter conductive trace may have to be lengthened accordingly from its minimum, most-direct-route length.

A common dielectric material for the layers of a printed circuit board is known as FR4. Additional types of material that have lower dielectric constants and faster propagation speeds include SPEEDBOARD™ C High Performance Prepreg and MICROLAM™ Dielectrics from W. L. Gore & Associates, Inc. The faster material is generally more expensive, so FR4 is more commonly used.

Dielectric constants (Er) for some materials may range between 1 (e.g. for a vacuum) and about 80 (e.g. for water). FR4, for instance, has an Er of about 4.7 for a propagation time of about 183.7 ps/in. SPEEDBOARD™ C has an Er of about 2.6 for a propagation time of about 137 ps/in. Practical dielectric constants, however, typically range from about 2 to about 5.

Additionally, it is known that the dielectric constant of, and the relative propagation speed through, the material may be affected by varying the construction techniques of the dielectric material. Thus, different processes, as well as different materials, may be used in construction of the printed circuit board to achieve the desired results of having a variety of propagation speeds in the printed circuit board.

An exemplary procedure for manufacturing a printed circuit board according to the present invention will be described with reference to FIG. 2. Typically, construction starts with a core layer including a dielectric material 290 (e.g. FR4) with a return (ground) or power plane 292 on one side and a conductive trace pattern 294 (including the conductive trace 234) on the other side. Then a "prepreg" layer (a flexible uncured epoxy resin) 296 is placed on the core layer 290/292/294. The dielectric material 290 and prepreg layer 296 are preferably of the same or similar dielectric constant, which forms the dielectric surrounding the conductive trace 234. Another core layer, including another dielectric material 298 (e.g. SPEEDBOARD™), a return or power plane 300 and a conductive trace pattern 302 (including the conductive trace 232), is placed on the prepreg layer 296. The prepreg layer 296 is then cured. Another prepreg layer (e.g. SPEEDBOARD™) 304 is placed on top of the core layer 298/300/302. The dielectric material 298 and prepreg layer 304 are preferably of the same or similar dielectric constant, which forms the dielectric surrounding the conductive trace 232. The process of placing core layers and prepreg layers together is repeated until the board 218 has the desired number of layers. Additionally, a final return or power plane 306 is typically placed on top of the last prepreg layer 304.

An alternative embodiment of the present invention may be incorporated within another type of circuit apparatus, such as an IC chip, as opposed to a printed circuit board (e.g. 218, FIG. 2). IC chips generally include several routing layers that have conductive traces within dielectric materials. The dielectric material in each layer, similar to the discussion above, is selected for its dielectric constant and signal propagation speed characteristics. Conductive traces of different lengths, but which carry signals that must be synchronized, are selectively placed within the routing layers depending on the lengths of the conductive traces and the propagation speeds of the routing layers. Thus, the shorter conductive traces are formed in routing layers having slower dielectric materials, and the longer conductive traces are formed in routing layers having faster dielectric materials.

We claim:

1. A computer system comprising:
   at least a first signal and a second signal having timing constraints relative to each other; and
   a circuit apparatus comprising a first layer having a first characteristic propagation speed and a second layer having a second characteristic propagation speed different from the first characteristic propagation speed, the first signal passing through the first layer and the second signal passing through the second layer;
   and wherein:
   the first layer of the circuit apparatus comprises a first material selected to have a first dielectric constant; and
   the second layer of the circuit apparatus comprises a second material, different from the first material, selected to have a second dielectric constant greater than the first dielectric constant.

2. A computer system as defined in claim 1 wherein the circuit apparatus comprises a printed circuit board.

3. A computer system as defined in claim 1 further comprising:
   a bus;
   and wherein the first and second signals comprise bus signals of the bus.

4. A computer system as defined in claim 1, wherein:
   the first signal propagates through the circuit apparatus in a propagation time period; and
   the second signal propagates through the circuit apparatus within a tolerance of the propagation time period.

5. A computer system as defined in claim 1, wherein:
   the first signal travels a longer distance than does the second signal.

6. A computer system as defined in claim 5, wherein:
   the first signal propagates through the circuit apparatus in a propagation time period; and
   the second signal propagates through the circuit apparatus within a tolerance of the propagation time period.

7. A computer system as defined in claim 1, further comprising:
   a plurality of first signals and a plurality of second signals;
   and wherein:
   the first signals pass through the first layer at the first characteristic propagation speed; and
   the second signals pass through the second layer at the second characteristic propagation speed.

8. A computer system as defined in claim 7, wherein:
   the first signals travel longer distances than do the second signals.

9. A computer system comprising:
   a circuit apparatus comprising at least N layers with N corresponding characteristic propagation speeds; and
   a plurality of signals comprising N signal groups in N corresponding length ranges, each signal group passing through one of the layers depending on the length range of the signal group and the characteristic propagation speed of the layer.

10. A computer system as defined in claim 9, wherein:
    the signals in each signal group pass through the circuit apparatus within a propagation time range.

11. A computer system comprising:
    a means for transferring signals between circuit components and having a plurality of layers within which the signals are transferred;
    a means for causing a first portion of the signals to propagate within a first layer of the transferring means at a first propagation speed, the first layer comprising a first material selected to have a first dielectric constant; and
    a means for causing a second portion of the signals to propagate within a second layer of the transferring means at a second propagation speed different from the first propagation speed, the second layer comprising a second material, different from the first material, selected to have a second dielectric constant different from the first dielectric constant.

12. A computer system as defined in claim 11, wherein:
    both causing means cause the first and second portions of the signals to propagate through the transferring means within a propagation time range.

13. A circuit apparatus comprising:
    a plurality of conductive traces for transferring a corresponding plurality of signals;
    a first layer in which a first portion of the conductive traces are disposed, which comprises a first material selected to have a first dielectric constant and which causes the signals transferred through the first portion of the conductive traces to transmit at a first propagation speed; and
    a second layer in which a second portion of the conductive traces are disposed, which comprises a second material, different from the first material, selected to have a second dielectric constant different from the first dielectric constant and which causes the signals transferred through the second portion of the conductive traces to transmit at a second propagation speed different from the first propagation speed.

14. A circuit apparatus as defined in claim 13, wherein:
    the first propagation speed is faster than the second propagation speed; and
    the first portion of the conductive traces are longer than the second portion of the conductive traces.

15. A circuit apparatus as defined in claim 14, wherein:
    the signals transferred through the first and second portions of the conductive traces are transferred within a propagation time range.

16. A circuit apparatus as defined in claim 13, wherein:
    the signals transferred through the first and second portions of the conductive traces are transferred within a propagation time range.

17. A circuit apparatus as defined in claim 13, further comprising:
    a plurality of integrated circuits (ICs), each comprising a plurality of input/output (I/O) pins connected to I/O pins of other ICs by the conductive traces to form a bus through which the signals are transferred.

18. A method for transferring signals in a layered circuit apparatus in a computer system, comprising:
    transmitting a first signal through a first layer in the layered circuit apparatus at a first propagation speed, the first layer comprising a first material selected to have a first dielectric constant; and transmitting a second signal, having timing constraints relative to the first signal, through a second layer in the layered circuit apparatus at a second propagation speed different from the first propagation speed, the second layer comprising a second material, different from the first material, selected to have a second dielectric constant different from the first dielectric constant.

19. A method as defined in claim 18, further comprising:

transmitting the first signal between first corresponding input/output (I/O) pins of first and second integrated circuits within a propagation time range; and transmitting the second signal between second corresponding I/O pins of the first and second integrated circuits within the propagation time range.

20. A method as defined in claim 18, further comprising:

providing at least first, second and third integrated circuits (ICs) connected to the layered circuit apparatus and each having a corresponding input/output (I/O) pin;

transmitting the first signal between the corresponding I/O pins of the first and second ICs within a propagation time range; and transmitting the second signal between the corresponding I/O pins of the second and third ICs within the propagation time range.

21. A method for synchronizing signals in a layered circuit apparatus in a computer system, comprising:

transmitting a first signal through a first signal path having a first length through the layered circuit apparatus at a first propagation speed within a propagation time range; and transmitting a second signal through a second signal path having a second length through the layered circuit apparatus at a second propagation speed within the propagation time range, the second length being shorter than the first length and the second propagation speed being slower than the first propagation speed.

22. A method for synchronizing signals in a layered circuit apparatus in a computer system, comprising:

transmitting a signal through a first conductive trace segment having a first length through the layered circuit apparatus at a first propagation speed within a propagation time range; and transmitting the signal through a second conductive trace segment having a second length through the layered circuit apparatus at a second propagation speed within the propagation time range, the second length being shorter than the first length and the second propagation speed being slower than the first propagation speed.

* * * * *